(12) United States Patent
Cheng

(10) Patent No.: US 9,692,399 B2
(45) Date of Patent: Jun. 27, 2017

(54) DIGITAL DELAY UNIT AND SIGNAL DELAY CIRCUIT

(71) Applicant: Silicon Motion, Inc., Jhubei, Hsinchu County (TW)

(72) Inventor: Yu-Hsuan Cheng, New Taipei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 15/008,919

(22) Filed: Jan. 28, 2016

(65) Prior Publication Data

US 2016/0241224 A1     Aug. 18, 2016

(30) Foreign Application Priority Data

Feb. 12, 2015  (TW) .............................. 104104674 A

(51) Int. Cl.
| | | |
|---|---|---|
| *H03H 11/26* | (2006.01) | |
| *H03K 5/14* | (2014.01) | |
| *H03K 5/00* | (2006.01) | |

(52) U.S. Cl.
CPC ..... *H03K 5/14* (2013.01); *H03K 2005/00019* (2013.01); *H03K 2005/00234* (2013.01)

(58) Field of Classification Search
CPC ........................................................ H03K 5/14
USPC ................................................ 327/277, 158
See application file for complete search history.

(56) References Cited

U.S. PATENT DOCUMENTS

| | | |
|---|---|---|
| 7,103,133 B2 | 9/2006 | Jung |
| 7,173,468 B2 | 2/2007 | Collins et al. |
| 7,304,520 B2 * | 12/2007 | Cho ........................ H03K 5/133 327/264 |
| 7,486,125 B2 | 2/2009 | Chae |
| 7,977,993 B2 | 7/2011 | Lu et al. |
| 7,982,517 B2 | 7/2011 | Kim |
| 8,072,248 B2 * | 12/2011 | Wan ........................ H03K 5/133 327/149 |
| 2003/0052719 A1 | 3/2003 | Na |
| 2004/0056690 A1 * | 3/2004 | Marbot ................... H03K 5/135 327/2 |
| 2014/0077852 A1 | 3/2014 | Gomm et al. |

FOREIGN PATENT DOCUMENTS

| | | |
|---|---|---|
| CN | 1983811 A | 6/2007 |
| KR | 100855274 B1 | 9/2008 |
| TW | 546646 B | 8/2003 |
| TW | 201103036 A | 1/2011 |
| TW | 1358902 B | 2/2012 |

\* cited by examiner

*Primary Examiner* — Lincoln Donovan
*Assistant Examiner* — Metasebia Retebo
(74) *Attorney, Agent, or Firm* — McClure, Qualey & Rodack, LLP

(57) ABSTRACT

An example of the invention provides a digital delay unit that is made up of a plurality of NAND gates. The digital delay unit includes a first delay path and a second delay path. The first delay path is coupled between a first input terminal and an output terminal to provide a basic time delay which is caused by one NAND gate. The second delay path is coupled between a second input terminal and the output terminal to provide at least three basic time delays.

2 Claims, 6 Drawing Sheets

DIGITAL DELAY UNIT AND SIGNAL DELAY CIRCUIT

CROSS REFERENCE TO RELATED APPLICATIONS

This Application claims priority of Taiwan Patent Application No. 104104674, filed on Feb. 12, 2015, the entirety of which is incorporated by reference herein.

BACKGROUND OF THE INVENTION

Field of the Invention

The present invention relates to a delay circuit, and more particularly to an all-digital delay circuit.

Description of the Related Art

With the advancement of semiconductor technology, the operating frequency of integrated circuits has become faster, and a situation of unsynchronization between the internal and external components of integrated circuits has become worse. To eliminate the unsynchronization situation, a phase locked loop (PLL) circuit or a delay-locked loop (DLL) circuit is applied to calibrate clock signals to ensure the clock phases of each components of the integrated circuits are the same. Generally, the PLL circuit comprises a voltage-controlled oscillator, and jitter in a PLL circuit causes the noise immunity of the PLL circuit to be worse than the noise immunity of a DLL circuit.

DLL circuits can be classified into two categories: analog DLL circuits and digital DLL circuits. In a digital DLL circuit, a digital delay line is applied to cause phase delay. However, a conventional digital delay line needs at least two components to cause phase delay, and the basic delay time of a digital delay line is too large under high-speed transmission. The phase calibration may be correctly executed accordingly.

FIG. 1A is a schematic diagram of a conventional digital delay line. The digital delay line shown in FIG. 1A uses 3 NAND gates, wherein the delay time of each NAND gate is $T_d$. Thus, the minimum delay time of the delay line in FIG. 1A is $2T_d$. The delay line of FIG. 1A has two delay paths. A first delay path is formed by the NAND gates 11 and 13, and a second delay path is formed by NAND gates 12 and 13. When a clock signal CLKA passes the first delay path, a phase delay of $2T_d$ is generated on the clock signal CLKA. Similarly, when a clock signal CLKB passes the second delay path, a phase delay of $2T_d$ is generated on the clock signal CLKB. However, if the phase delay required by the clock signal CLKA or CLKB is less than $2T_d$, the digital delay line of FIG. 1A is not appropriate to provide the phase delay.

FIG. 1B is a schematic diagram of another conventional digital delay line. In FIG. 1B, the delay time of NAND gate 101 or 102 is $T_d$, and the delay time of the inverter 103 is T. If the phase delay required by the clock signal CLKA or CLKB is less than $2T_d$ or $(T_d+T)$, the digital delay line of FIG. 1B is not appropriate to provide the phase delay.

BRIEF SUMMARY OF THE INVENTION

To increase the performance of an all-digital delay line, the proposed innovation provides an all-digital delay line that can provide a minimum phase delay time that is equal to the delay time of a NAND gate.

An embodiment of the invention provides a digital delay unit that is made up of a plurality of NAND gates. The digital delay unit comprises a first delay path and a second delay path. The first delay path is coupled between a first input terminal and an output terminal. The second delay path is coupled between a second input terminal and the output terminal, wherein the first delay path provides a basic time delay which is caused by one NAND gate.

Another embodiment of the invention provides a digital delay unit. The digital delay unit comprises an inverter, a first signal input terminal, a first NAND gate, a second NAND gate, a third NAND gate, a fourth NAND gate and a second input terminal. The inverter receives a first signal. The first signal input terminal is coupled to a first input terminal of a first NAND gate. A second input terminal of the first NAND gate is coupled to an output terminal of the inverter. The second NAND gate has a first input terminal coupled to an output terminal of the first NAND gate. The third NAND gate has a first input terminal coupled to an output terminal of the second NAND gate, and a second input terminal coupled to a second signal input terminal. The fourth NAND gate has a first input terminal to receive the first signal, a second input terminal to receive a second input terminal, and an output terminal coupled to a second input terminal of the second NAND gate. When the first input terminal receives an input signal, a logic level of the input signal is set to be 1, and when the second input terminal receives the input signal, the logic level of the input signal is set to be 0, and a logic level of the first input signal is set to be 1.

Another embodiment of the invention provides a time-delay circuit comprising a delay control circuit and a digital delay circuit. The delay control circuit generates a control signal according to an input signal and a reference signal. The digital delay circuit is made up of a plurality of NAND gates to receive the input signal, delay the input signal according to the control signal to generate a delayed input signal, wherein the minimum time delay of the digital delay circuit is the time delay of a NAND gate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims._

Figure 1A:
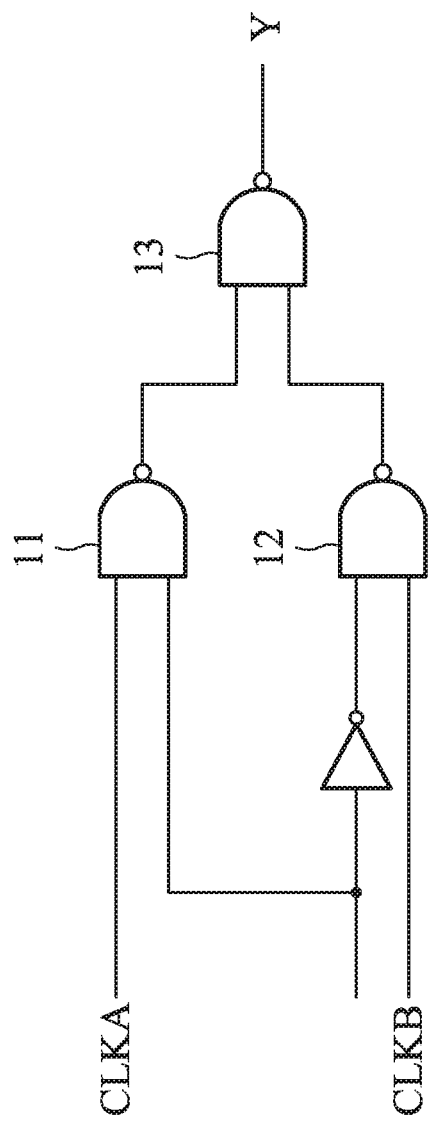
FIG. 1A is a schematic diagram of a conventional digital delay line.
Figure 1B:
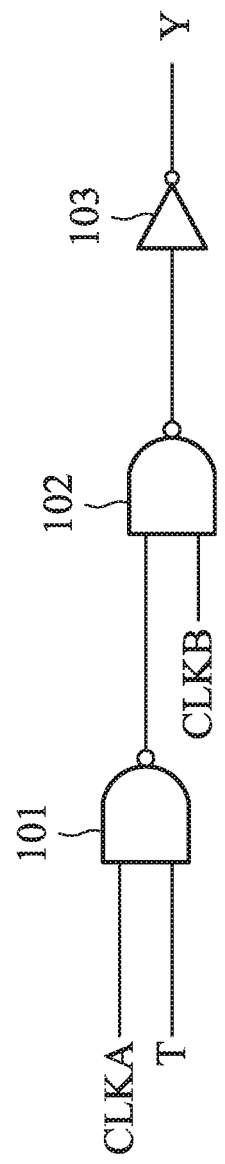
FIG. 1B is a schematic diagram of another conventional digital delay line.
Figure 2:
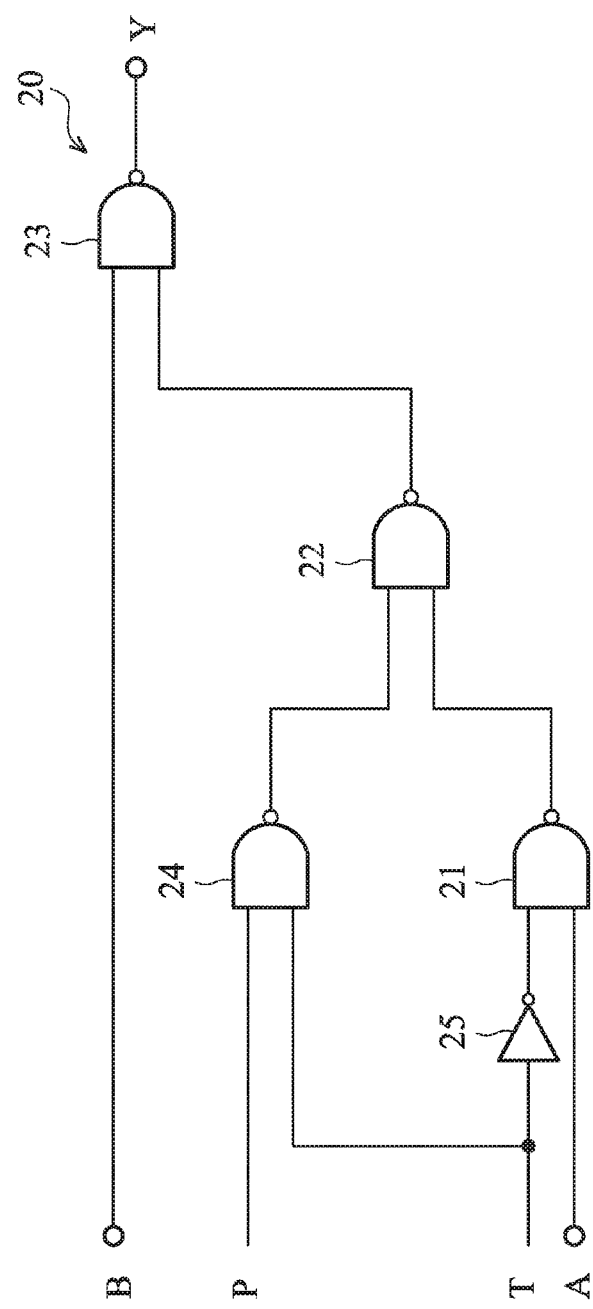
FIG. 2 is a schematic diagram of a digital delay unit according to an embodiment of the invention.

FIG. 2 is a schematic diagram of a digital delay unit according to an embodiment of the invention. The digital delay unit 20 of FIG. 2 can be applied in a digital delay line, the clock signal can be injected in the clock input terminal A or B, and a delayed clock signal is output by the out terminal Y. The digital delay unit 20 comprises a first NAND gate 21, a second NAND gate 22, a third NAND gate 23 and a fourth NAND gate 24. The first NAND gate 21 has a first input terminal coupled to the clock input terminal A and a second input terminal coupled to an output terminal of the inverter 25, wherein the inverter 25 receives a signal T. The fourth NAND gate 24 has a first input terminal to receive a signal P and a second input terminal to receive a signal T. The second NAND gate 22 has two input terminals coupled to an output terminal of the first NAND gate 21 and an output terminal of the fourth NAND gate 24 respectively. The third NAND gate 23 has two input terminals coupled to the clock input terminal B and the output terminal of the second NAND gate 22, respectively.

When a first clock signal is injected in the clock input terminal A, a logic level of signal T is set to be 0 to ensure the second NAND gate 22 outputs the delayed first clock signal. The logic level of the clock input terminal B is set to be 1 to ensure the third NAND gate 23 outputs the delayed first clock signal. When the first clock signal in injected in the clock input terminal B, the logic level of signal T is set to be 1 and the logic level of the output terminal of the second NAND gate 22 is 1 to ensure the third NAND gate 23 outputs the delayed first clock signal. The operation of the digital delay unit 20 requires an extra control signal T, and signals for controlling the logic level of clock input terminal A or B.

Assuming a delay time of each NAND gate is $T_d$, the digital delay unit 20 provides two different phase delay times $T_d$ and $3T_d$. The digital delay unit 20 has a first delay path and a second delay path. The first delay path starts at the clock input terminal B and ends at the output terminal Y. The second delay path starts at the clock input terminal A and ends at the output terminal Y. When a clock signal passes through the first delay path, the clock signal is only delayed by the third NAND gate 23. When a clock signal passes through the second delay path, the clock signal is delayed by the first NAND gate 21, the second NAND gate 22, and the third NAND gate 23.

If the clock signal needs to be delayed for the phase delay time $T_d$, the clock signal is injected in the clock input terminal B. A phase delay time $T_d$, caused by the first delay path, between the original clock signal and the clock signal output by the output terminal Y is generated. If the clock signal needs to be delayed for the phase delay time $3T_d$, the clock signal is injected in the clock input terminal A. A phase delay time $3T_d$, caused by the second delay path, between the original clock signal and the clock signal output by the output terminal Y is generated accordingly.

Compared with the conventional digital delay line, the proposed digital delay line is able to provide a minimum phase delay time caused by only one NAND gate, and it significantly increases the operation frequency range of circuits.

Figure 3:
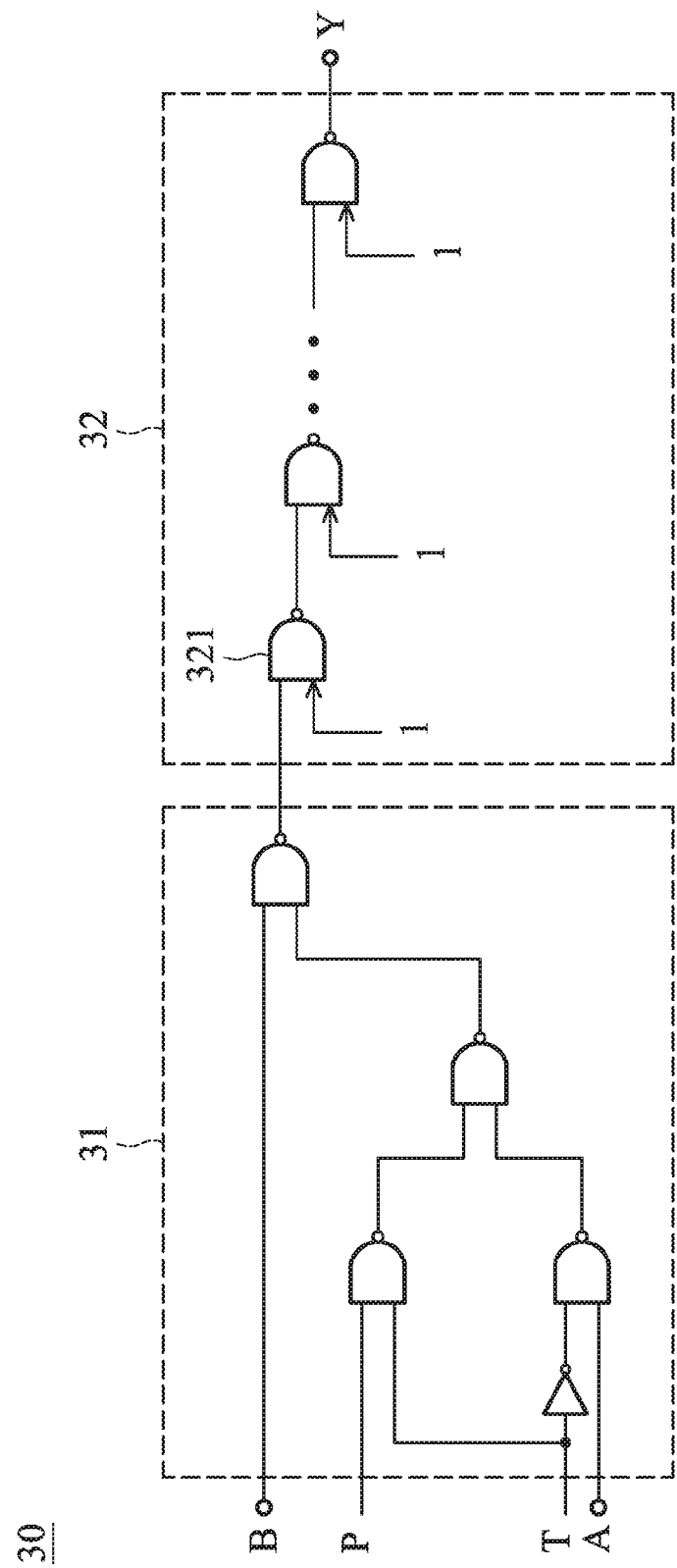
FIG. 3 is a schematic diagram of a digital delay line according to an embodiment of the invention.

FIG. 3 is a schematic diagram of a digital delay line according to an embodiment of the invention. The digital delay line 30 comprises a first digital delay unit 31 and a second digital delay unit 32. Assuming that the delay time of each NAND gate is $T_d$, the first digital delay unit 31 provides two different phase delay times $T_d$ and $3T_d$. The second digital delay unit 32 comprises a number of NAND gates, wherein the number is adjustable. In one embodiment, the number of NAND gates is determined based on a phase delay time required by the input clock signal.

In FIG. 3, the input clock signal is output from the terminal Y, however, any output terminal of the NAND gate can serve as an output terminal to output the delayed signal according to a control circuit and corresponding control signal. For example, if the input clock signal needs to be delayed by delay time $2T_d$, the control circuit controls the second delay unit 32 to cause the delayed clock signal to be output by the output terminal of the NAND gate 321. Therefore, the phase delay between the input clock signal and the output clock signal is $2T_d$.

Furthermore, each NAND gate of the second digital delay unit 32 comprises two input terminals, wherein one input terminal is coupled to an output terminal of a previous stage of the NAND gate, and another input terminal continuously receives a logic 1 signal.

Moreover, assuming the digital delay line 30 is a 16-stage digital delay line, the minimum number of NAND gates is 19 according to the schematic structure of the proposed digital delay line 30. The proposed digital delay line 30 can reduce the number of NAND gates and the layout area of the digital delay line 30.

Figure 4:
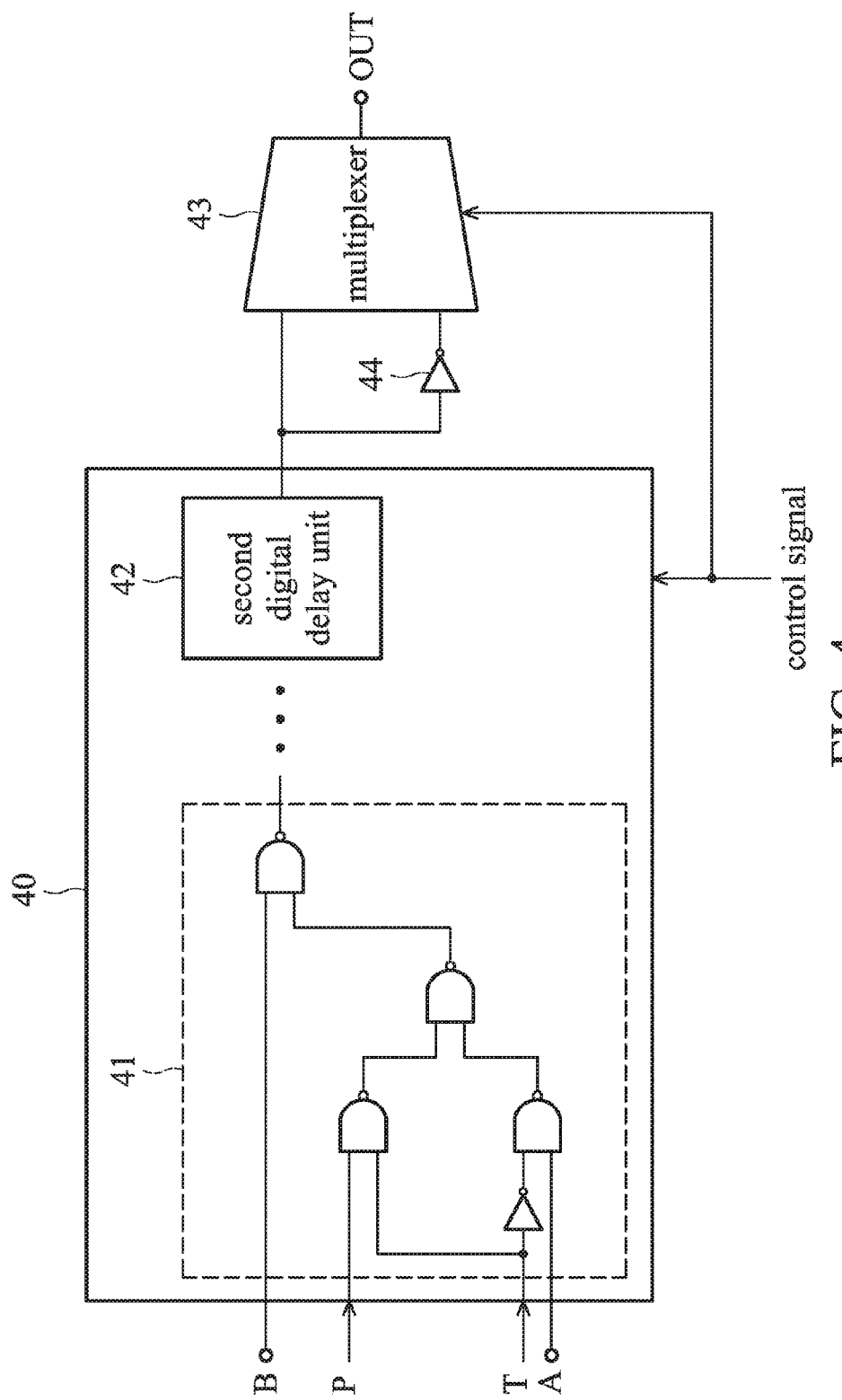
FIG. 4 is a schematic diagram of a digital delay line according to another embodiment of the invention.

FIG. 4 is a schematic diagram of a digital delay line according to another embodiment of the invention. The digital delay line 30 comprises a first digital delay unit 41 and a second digital delay unit 42, wherein a plurality of digital delay units are coupled between the first digital delay unit 41 and the second digital delay unit 42. In the embodiment, the details of the circuitry of the second digital delay unit 42 is the same as the circuits in the first digital delay unit 41, or the other digital delay units, and the NAND gates used in each digital delay unit are the same. In this embodiment, each digital delay unit provides a delay time $T_d$ caused by one NAND gate, and the total delay time for an input signal is determined by a control signal. In the embodiment, the signal to be delayed is input to the clock input terminal B, and a logic level of signal T is set to be 1.

The output signal of the digital delay line 40 is transmitted to an input terminal of the multiplexer 43 and an inverter 44. Another input terminal of the multiplexer 43 is coupled to the output terminal of the inverter 44. Since the signal passing through each digital delay unit is only delayed by one NAND gate, the output signal of the digital delay line 40 may be inverted according to the number of NAND gates that the input signal has passed. If the delay time of the input signal is $N*T_d$ and N is an odd number, the multiplexer 43 transmits the output signal of the inverter 44 to the output terminal OUT.

If the delay time of the input signal is $2N*T_d$ and N is an integer, the multiplexer 43 transmits the output signal of the digital delay line 40 to the output terminal OUT. Furthermore, in the embodiment, the multiplexer is implemented by a plurality of NAND gates.

Figure 5:
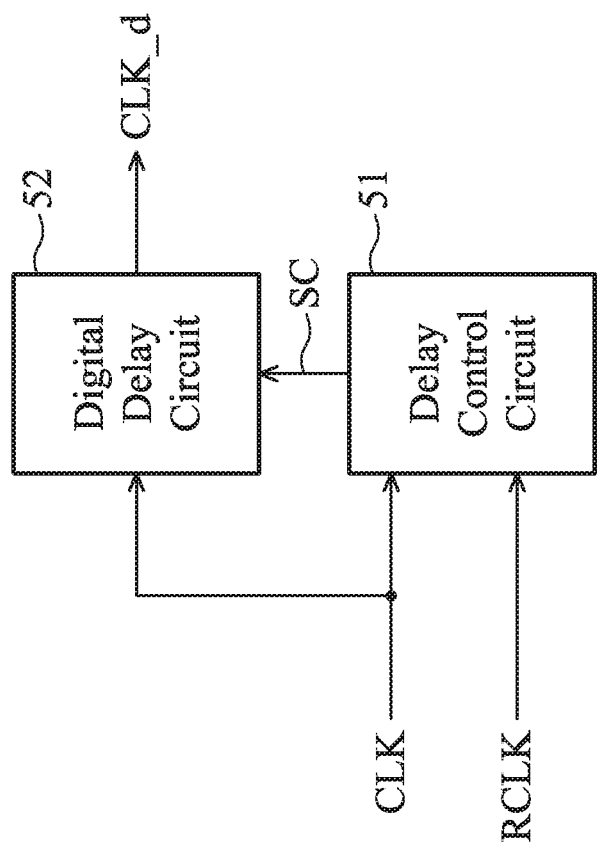
FIG. 5 is a schematic diagram of a signal delay circuit according to an embodiment of the invention.

FIG. 5 is a schematic diagram of a signal delay circuit according to an embodiment of the invention. The signal delay circuit comprises a delay control circuit 51 and a digital delay circuit 52. The delay control circuit 51 receives a reference clock signal RCLK and generates a control signal Sc. In this embodiment, the control signal Sc is a digital code. The control signal Sc is determined based on the phase difference between the input clock signal CLK and the reference clock signal RCLK. The digital delay circuit 52 delays the input clock signal CLK to generate an output signal CLK_d. In this embodiment, the implementation of the digital delay circuit 52 can be referred to in the design shown in FIGS. 2~4.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital delay unit, comprising:
an inverter to receive a first signal;
a first signal input terminal coupled to a first input terminal of a first NAND gate;
the first NAND gate having a second input terminal coupled to an output terminal of the inverter;
a second NAND gate, having a first input terminal coupled to an output terminal of the first NAND gate;
a third NAND gate, having a first input terminal coupled to an output terminal of the second NAND gate, and a second input terminal coupled to a second signal input terminal; and
a fourth NAND gate having a first input terminal to receive the first signal, a second input terminal to receive a second signal, and an output terminal coupled to a second input terminal of the second NAND gate,
wherein when the first signal input terminal receives an input signal that is a clock signal, a logic level of the first signal is set to be 0 and the logic level of the second signal input terminal is set to be 1, and when the input signal is sent to the digital delay unit via the second signal input terminal, the logic level of the first signal is set to be 1, and a logic level of the second signal is set to be 1.

2. A time-delay circuit, comprising:
a delay control circuit to generate a control signal according to an input signal and a reference signal, wherein the input signal is a clock signal; and
a digital delay circuit to receive the input signal, delay the input signal according to the control signal to generate a delayed input signal, wherein a minimum time delay of the digital delay circuit is a time delay of a NAND gate,
wherein:
the digital delay circuit comprises at least one digital delay unit; and
the digital delay unit comprises:
an inverter to receive a first signal;
a first signal input terminal coupled to a first input terminal of a first NAND gate;
the first NAND gate having a second input terminal coupled to an output terminal of the inverter;
a second NAND gate, having a first input terminal coupled to an output terminal of the first NAND gate;
a third NAND gate, having a first input terminal coupled to an output terminal of the second NAND gate, and a second input terminal coupled to a second signal input terminal; and
a fourth NAND gate having a first input terminal to receive the first signal, a second input terminal to receive a second signal, and an output terminal coupled to a second input terminal of the second NAND gate,
wherein when the input signal is sent to the digital delay unit via the first signal input terminal, a logic level of the first signal is set to be 0 and the logic level of the second signal input terminal is set to be 1, and when the input signal is sent to the digital delay unit via the second signal input terminal, the logic level of the first signal is set to be 1, and a logic level of the second signal is set to be 1.

* * * * *